(12) United States Patent
Ozaki et al.

(10) Patent No.: US 9,029,709 B2
(45) Date of Patent: May 12, 2015

(54) TRANSPARENT FLEXIBLE PRINTED WIRING BOARD AND METHOD FOR MANUFACTURING THE SAME

(75) Inventors: Kazuyuki Ozaki, Hiratsuka (JP); Masayuki Iwase, Tsukubarmirai (JP)

(73) Assignee: Nippon Mektron, Ltd., Tokyo-To (JP)

( * ) Notice: Subject to any disclaimer, the term of this patent is extended or adjusted under 35 U.S.C. 154(b) by 403 days.

(21) Appl. No.: 13/503,752

(22) PCT Filed: Feb. 10, 2011

(86) PCT No.: PCT/JP2011/052882
§ 371 (c)(1),
(2), (4) Date: Apr. 24, 2012

(87) PCT Pub. No.: WO2011/145367
PCT Pub. Date: Nov. 24, 2011

(65) Prior Publication Data
US 2012/0205144 A1   Aug. 16, 2012

(30) Foreign Application Priority Data

May 21, 2010   (JP) ................. 2010-117425

(51) Int. Cl.
*H05K 1/03* (2006.01)
*H05K 3/12* (2006.01)
*H05K 3/28* (2006.01)
*G06F 3/044* (2006.01)

(52) U.S. Cl.
CPC .............. *H05K 1/0393* (2013.01); *G06F 3/044* (2013.01); *H05K 3/125* (2013.01); *H05K 3/1283* (2013.01); *H05K 3/28* (2013.01); *H05K 2201/0108* (2013.01); *H05K 2201/0154* (2013.01); *H05K 2201/0326* (2013.01); *H05K 2201/0329* (2013.01)

(58) Field of Classification Search
CPC .... H05K 1/0393; H05K 3/125; H05K 3/1283
USPC .................................... 29/830; 174/255–260
See application file for complete search history.

(56) References Cited

FOREIGN PATENT DOCUMENTS

| JP | 56-118204 | 9/1981 |
|---|---|---|
| JP | 04-323232 | 11/1992 |
| JP | 2002-358824 | 12/2002 |
| JP | 2006-137114 | 6/2006 |
| JP | 2007-234299 | 9/2007 |

(Continued)

OTHER PUBLICATIONS

R. Paetzold et al., "Performance of flexible polymeric light-emitting diodes under bending conditions," Applied Physics Letters, May 12, 2003, vol. 82, No. 19, pp. 3342-3344.

(Continued)

*Primary Examiner* — Jeremy C Norris
(74) *Attorney, Agent, or Firm* — Jacobson Holman, PLLC.

(57) ABSTRACT

Provided is a transparent flexible printed wiring board which is excellent in flexibility, heat resistance and adhesion between a transparent film and a transparent conductive film. A transparent polyimide film, whose dimension change rate in association with a baking process is not larger than ±0.2%, is prepared. ITO ink containing ITO fine particles and a binder is printed in the form of a predetermined pattern on the transparent polyimide film by an ink-jet method. The ITO ink is then baked at 230 to 300° C., thereby forming a transparent conductive film with a binder ratio of 5 to 10 wt %.

11 Claims, 2 Drawing Sheets

(56) References Cited

FOREIGN PATENT DOCUMENTS

| | | |
|---|---|---|
| JP | 2007-332289 | 12/2007 |
| JP | 2008-015571 | 1/2008 |
| JP | 2008-130355 | 6/2008 |
| JP | 2008-140724 | 6/2008 |
| JP | 2009-138142 | 6/2009 |
| JP | 2009-224071 | 10/2009 |
| JP | 2009-302252 | 12/2009 |
| JP | 2010-086285 | 4/2010 |
| TW | 200629571 A | 8/2006 |
| TW | 200823070 A | 6/2008 |
| TW | 200832696 A | 8/2008 |
| WO | 2007/003405 | 1/2007 |
| WO | 2009/043482 | 4/2009 |

OTHER PUBLICATIONS

Taiwanese Office Action issued on Dec. 1, 2014 to a corresponding Taiwanese Patent Application No. 10117801.

TRANSPARENT FLEXIBLE PRINTED WIRING BOARD AND METHOD FOR MANUFACTURING THE SAME

This is a national stage of PCT/JP11/052882 filed Feb. 10, 2011 and published in Japanese, which claims the priority of Japanese number 2010-117425 filed May 21, 2010, hereby incorporated by reference.

TECHNICAL FIELD

The present invention relates to a transparent flexible printed wiring board and a method for manufacturing the same, and particularly to a transparent flexible printed wiring board having heat resistance and a method for manufacturing the same.

BACKGROUND ART

As a transparent wiring board used, for example, for a touch panel, one using a glass substrate is hitherto known. This transparent wiring board is formed such that an ITO (Indium Tin Oxide) film is formed on a glass substrate and then processed by etching, to form a transparent conductive film (transparent wiring pattern) having a desired pattern. Since the glass substrate is used, this transparent wiring board has a problem of being heavy and fragile, and further being high-priced.

Moreover, there has recently been a demand for a light-weight transparent wiring board having impact resistance due to application to electronic paper and the like.

Hence there is known a transparent wiring board using, as a substrate, a transparent film made of polyethylene terephthalate (PET) or polyethylene naphthalate (PEN).

The transparent wiring board is produced in the following manner. First, an ITO film is formed by sputtering on a transparent film made of PET or PEN. Subsequently, an exposure process, a development process and the like are performed to form a resist layer having a predetermined pattern on the ITO film. The ITO film is then etched with this resist layer used as a mask, to form a transparent conductive film having a desired pattern on the transparent film.

However, the above transparent wiring board has a problem of having heat resistance not sufficient to be used as a printed wiring board where components are mounted.

Normal PET has a heat-resistant temperature in the order of 130° C., and even heat-resistant PET has a heat-resistant temperature of about 150° C. For this reason, a transparent wiring board using PET is not applicable to a product (touch panel, electronic paper, LED illumination, EL illumination, etc.) required to be subjected to heat treatment at a high temperature such as a reflow process or an ACF (Anisotropic Conductive Film) connecting process.

Further, the ITO film formed on the transparent PET film has not succeeded in acquiring sufficient characteristics, in terms of flexibility and adhesion to the transparent film, to be used as a flexible printed wiring board required to have bending resistance (see Non-patent Document 1).

On the other hand, PEN has a relatively high heat-resistant temperature (about 180° C.), and can thus be subjected to a process which is a low-temperature reflow process using special solder or a low-temperature ACF connection process. However, PEN and the special solder are high-priced and special manufacturing facilities are required, thereby causing a problem of increased production cost.

Moreover, in the case of performing an etching process for forming a transparent wiring pattern, material use efficiency is low since lots of materials are disposed, and further, a large amount of carbon dioxide ($CO_2$) is generated. The process is thus required to be changed to an environment-friendly process.

PRIOR ART DOCUMENT

Non-Patent Document

[Non-Patent Document 1]
"Performance of flexible polymeric light-emitting diodes under bending conditions", APPLIED PHYSICS LETTERS Vol. 82, No. 19 (12 May, 2003)

DISCLOSURE OF THE INVENTION

Problem to be Solved by the Invention

It is an object of the present invention is to provide a transparent flexible printed wiring board having excellent heat resistance.

Means for Solving the Problem

According to a first aspect of the present invention, there is provided a method for manufacturing a transparent flexible printed wiring board, including: preparing a transparent insulating film whose dimension change rate in association with a heat process at 230 to 300° C. is not larger than ±0.2%; printing ITO ink, which contains ITO fine particles and a binder, in the form of a predetermined pattern on the transparent insulating film by an ink-jet method; and baking the ITO ink, thereby forming a transparent conductive film with a binder ratio of 5 to 10 wt %.

According to a second aspect of the present invention, there is provided a method for manufacturing a transparent flexible printed wiring board, including: preparing a transparent insulating film whose dimension change rate in association with a heat process at 230 to 300° C. is not larger than ±0.2%; printing PEDOT ink in the form of a predetermined pattern on the transparent insulating film by a screen-printing method or an ink-jet method; drying the PEDOT ink, thereby forming a transparent conductive film; and forming a heat-resisting transparent insulating protection film by a printing technique so as to coat at least a part of the transparent conductive film.

According to a third aspect of the present invention, there is provided a transparent flexible printed wiring board, including: a transparent insulating film whose dimension change rate in association with a heat process at 230 to 300° C. is not larger than ±0.2%; and a transparent conductive film obtained by baking ITO ink and formed on the transparent insulating film, as well as a transparent conductive film with a binder ratio of 5 to 10 wt %.

According to a fourth aspect of the present invention, there is provided a transparent flexible printed wiring board, including: a transparent insulating film whose dimension change rate in association with a heat process at 230 to 300° C. is not larger than ±0.2%; a transparent conductive film obtained by drying the PEDOT ink and formed on the transparent insulating film; and a heat-resisting transparent insulating protection film formed so as to coat the transparent conductive film.

Effects of the Invention

The present invention uses, as a substrate, a transparent insulating film whose dimension change rate in association with a heat process at 230 to 300° C. is not larger than ±0.2%. It is thereby possible, at the time of forming a transparent conductive film by a baking process, to prevent a crack from being generated in the transparent conductive film or the transparent conductive film from being delaminated from the transparent insulating film. As a result, a high-quality transparent flexible printed wiring board can be obtained.

Further, since the high-quality transparent flexible printed wiring board according to the present invention uses, as a substrate, a transparent insulating film that endures a baking process performed at a high temperature for a long period of time, it has heat resistance to heat processes performed at a high temperature for a short period of time, such as a reflow process and an ACF connection process.

In addition, the baked ITO ink film (transparent conductive film) is made to contain a binder at a ratio of 5 to 10 wt %, thereby having excellent characteristics in terms of any of flexibility, conductivity, and adhesion between the transparent film substrate and the transparent conductive film.

MODE FOR CARRYING OUT THE INVENTION

Figure 1:
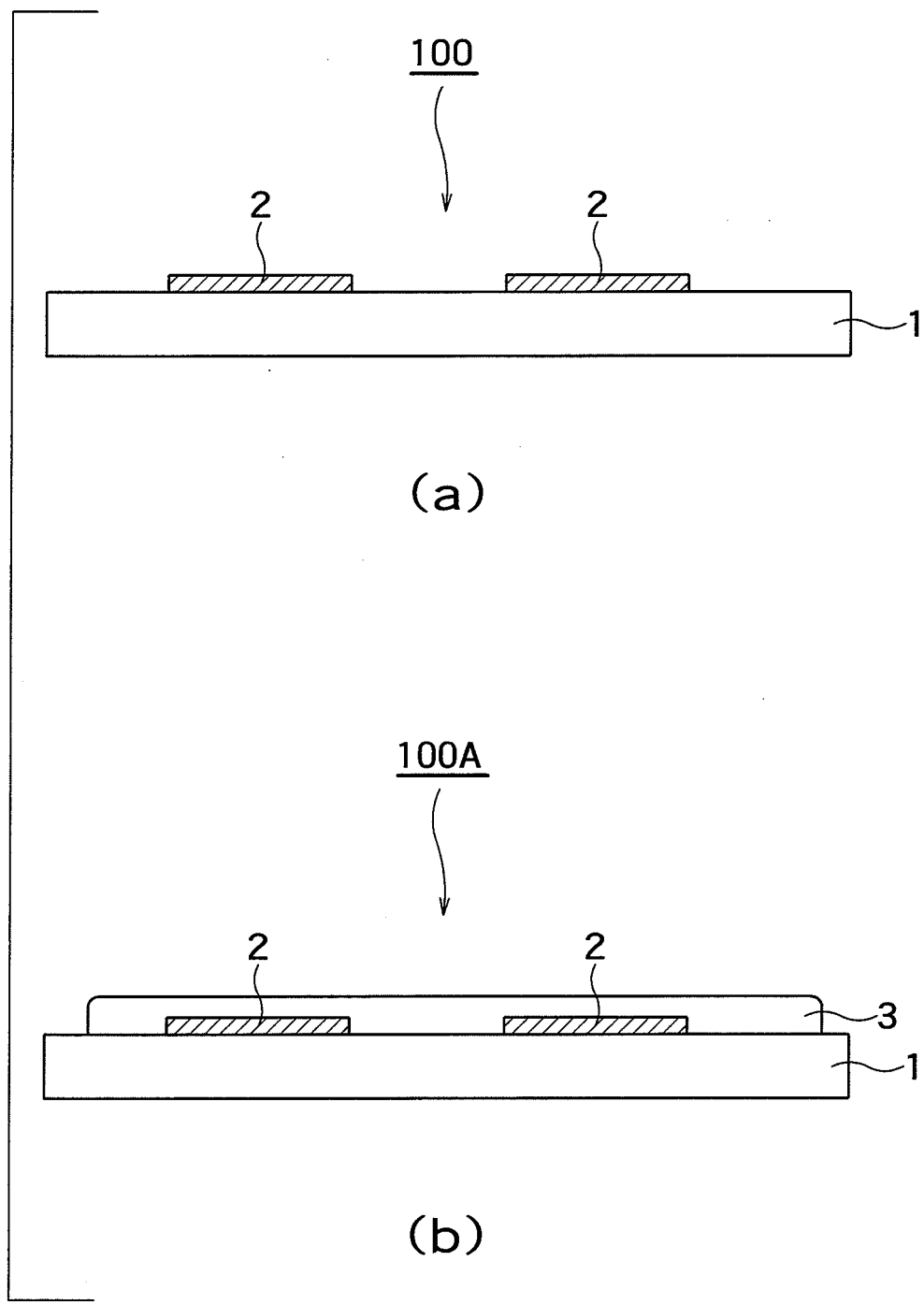
FIGS. 1(a) and 1(b) are respectively sectional views of transparent flexible printed wiring boards according to Example 1 and its modified example.

In the present invention, an insulating transparent film having heat resistance is used as a substrate of a transparent flexible printed wiring board. Then, using a printing technique such as an ink-jet method or a screen-printing method, a type of ink which can form a transparent conductive film is printed on the transparent film. As such ink, not only ITO ink but also ink made of an organic conductive polymer, such as PEDOT (polyethylene dioxythiophene) ink, can be used. Subsequently, the ink is baked or dried to form a transparent conductive film having a predetermined pattern.

First, there will be described a heat resistance level that should be satisfied by the transparent film. Herein, the heat resistance refers to satisfying predetermined mechanical and optical characteristics after performance of the heat process at a high temperature. Such a heat process includes a printed-ink baking process (e.g., 230 to 300° C., one hour), a reflow process (e.g., in the air, 260° C., a short period of time [in the order of several seconds to several tens of seconds]) at the time of mounting components on the transparent flexible printed wiring board, and the like.

Examples of the optical characteristics required for the transparent film include that a light transmittance does not significantly decrease and that coloring (yellowing) does not occur.

Meanwhile, examples of the mechanical characteristics required for the transparent film include a dimension change rate in association with the heat process. The dimension change rate herein means an extension rate or a shrinkage rate of the transparent film in the process of heating to a predetermined temperature in the heat process (ink baking [drying] process, reflow process, etc.) and subsequent gradual cooling to a room temperature.

The dimension change rate is defined by the following formula:

$$(L_1-L_2)/L_1 \times 100 [\%]$$

Here, $L_1$ represents a size of the transparent film at the maximal temperature in the heat process, and $L_2$ represents a size of the transparent film at the room temperature.

The dimension change rate is particularly important in ensuring the quality of the transparent flexible printed wiring board. In the present invention, there is used a transparent film whose dimension change rate is not larger than a predetermined value until the temperature returns from the temperature in the baking process to the room temperature. This is because, in the case of a larger dimension change rate, there are great chances of occurrence of cracking in the transparent conductive film and delamination between the transparent conductive film and the transparent film. A principal reason for occurrence of such damage on the transparent conductive film is that, in either case of using the ITO ink or the PEDOT ink, a yield of the transparent conductive film obtained through the baking (drying) process is as small as not larger than 25 wt % and a large change in volume occurs at the time of baking (drying).

Hence, the transparent film to be used as the substrate needs to satisfy a predetermined dimension change rate in order to ensure the quality of the transparent flexible printed wiring board.

Specifically, in the case of using the ITO ink containing ITO fine particles and a binder as a material for the transparent conductive film, the dimension change rate in association with the baking process (230 to 300° C., one hour) needs to be not larger than ±0.2%.

It is to be noted that, even in the case of using the PEDOT ink, the dimension change rate is desirably not larger than ±0.2%. This is because, in the case of forming an organic transparent conductive film by use of the PEDOT ink, a drying temperature after ink-printing is 100 to 150° C., which is low as compared with the baking temperature for the ITO ink. However, cracking or delamination occurs in the formed transparent conductive film when the dimension change rate is large, as in the case of the ITO ink.

Next, there will be described the characteristics required for the ink so as to form the transparent conductive film.

The organic transparent conductive film, obtained by drying the PEDOT ink or the like, contains a large amount of organic substance and has good adhesion to the transparent film, as well as having sufficient flexibility.

In the case of the ITO ink, a ratio of a binder in the ITO ink needs to be adjusted in order to ensure flexibility and adhesion to the transparent film. Thereby, a slight amount of binder is made to remain after baking of the ink so as not to bring ITO into a perfect crystal state. However, the binder ratio should be reduced for increasing conductivity of the transparent conductive film. Accordingly, the binder ratio is preferably adjusted in consideration of conductivity, adhesion, and flexibility of the transparent conductive film.

Specifically, in the case of using the ITO ink, the binder ratio after baking is desirably from 5 wt % to not larger than 10 wt %, from the viewpoint of flexibility, adhesion, and conductivity of the transparent conductive film after baking.

The binder ratio after baking is defined by the following formula:

$$W_b/W_{ITO} \times 100 [\%]$$

Here, $W_b$ represents a weight of the binder after baking, and $W_{ITO}$ represents a weight of the ITO ink (transparent conductive film) after baking.

Further, in the case of printing by the ink-jet method, both the ITO ink and the PEDOT ink need to have viscosity and surface tensions in predetermined ranges so as to suppress blurring and thickness unevenness of printed ink.

Specifically, the viscosity of the ink needs to be in the range of 2 to 20 mPa·S at a room temperature (23° C.).

The surface tension of the ink needs to be in the range of 20 to 40 mN/m at a room temperature (23° C.). Further, the surface tension is desirably in the range of 25 to 35 mN/m at the room temperature (23° C.) so as to suppress blurring of the ink on the transparent film immediately after printing.

In addition, it is also necessary to use a transparent film having an appropriate surface tension for suppressing blurring and thickness unevenness of the ink after printing.

Examples of a measurable parameter, which replaces the surface tension depending on a surface state and a temperature of the transparent film, include a contact angle between the transparent film and a liquid dropped thereon. Specifically, it is desirable to use a transparent film whose contact angle with a water droplet dropped thereon is in the range of 60 to 80° at the room temperature (23° C.).

Incidentally, as described in a later-mentioned example, the transparent flexible printed wiring board according to the present invention may include, as necessary, a heat-resisting insulating protection film which is formed so as to coat a part or a whole of the transparent conductive film in order to protect the transparent conductive film. In the case of an organic transparent conductive film using the PEDOT ink, providing the insulating protection film is essential for the purpose of preventing oxidation at the time of the heat process.

A material for the insulating protection film is required to have transparency and heat resistance. As for the heat resistance, the material needs to have resistance to a heat process performed at not lower than 260° C. for a short period of time (in the order of several seconds to several tens of seconds) in order to endure the reflow process after formation of the insulating protection film.

As a material for the insulating protection film, a solvent that neither erodes nor dissolves the transparent conductive film needs to be used. The insulating protection film is desirably formed by the printing technique from the viewpoint of high efficiency in use of the material and simplification of the process.

Hereinafter, four examples according to the present invention will be described. Example 1 is an example where the ITO ink is printed by the ink-jet method. Examples 2 and 3 are examples where the PEDOT ink is printed respectively by the screen-printing method and the ink-jet method. Example 4 is an example where two layers of transparent conductive films are formed via an insulating protection film.

Example 1

In Example 1, a transparent polyimide film (thickness of 70 µm) is used as a substrate, and the ITO ink is applied onto the transparent polyimide film in the form of a predetermined pattern by the ink-jet method. Herein, Neopulim (LH-3430), manufactured by MITSUBISHI GAS CHEMICAL COMPANY, INC., was used as the transparent polyimide film. A dimension change rate of the transparent polyimide film in the process of gradually cooling the temperature (230° C. in the present example) at the time of baking to return to a room temperature, namely a dimension change rate in association with the baking process, was confirmed to be not larger than ±0.2%.

A general type of ITO ink, which contains an organic binder and has ITO fine particles dispersed in the solvent, was used.

Next, there will be described a method for manufacturing the transparent flexible printed wiring board according to the present example.

(1) After optimization of ink-jet conditions (setting of the viscosity and surface tension of the ITO ink in the foregoing ranges), the ITO ink was printed in the form of a predetermined pattern on a transparent polyimide film 1 by the ink-jet method. In addition, it is preferable to preliminarily heat the transparent polyimide film 1 to 40 to 60° C. before printing. This can prevent an ink droplet from wetting and spreading after its landing on the film.

(2) Subsequently, a sample printed with the ink droplet was dried at 120° C. for 30 minutes to evaporate a solvent with a low boiling point in the ITO ink.

(3) Thereafter, the baking process was performed in the air at 230° C. for one hour to bake the printed ITO ink, so as to form a transparent conductive film 2 (ITO film) having a predetermined pattern. It was confirmed that a ratio of the binder remnant in the transparent conductive film 2 was in the range of 5 to 10 wt %.

It is to be noted that the atmosphere in the baking process may be nitrogen gas or reducing gas. As the reducing gas, gas obtained by adding hydrogen in the order of several percent to nitrogen may be used, or gas obtained by introducing formic acid (HCOOH) under reduced pressure may be used. The atmosphere in the baking process is selected based on the relation between conductivity required for the transparent conductive film and cost of facilities and the like. That is, the conductivity of the formed transparent conductive film increases in the following order: the air, nitrogen, and the reducing gas. The facility cost also increases in this order. Therefore, the atmosphere is preferably selected in accordance with a purpose.

FIG. 1(a) shows a transparent flexible printed wiring board 100 produced through the above process.

It is to be noted that as in a transparent flexible printed wiring board 100A shown in FIG. 1(b), a transparent insulating protection film 3 that coats the transparent conductive film 2 may be formed. The insulating protection film 3 can, for example, be formed by printing a transparent resist. Similarly to the transparent polyimide film 1 and the transparent conductive film 2, the insulating protection film 3 is required to have heat resistance to the heat process (reflow process, etc.), to which the transparent flexible printed wiring board is to be subjected.

The transparent flexible printed wiring board 100 according to the present example was evaluated in terms of light transmittance, electric resistance (conductivity), adhesion, flexibility, and heat resistance. Table 1 shows evaluation results.

TABLE 1

| EVALUATION ITEM | RESULT |
| --- | --- |
| THICKNESS OF TRANSPARENT CONDUCTIVE FILM (ITO FILM) | ABOUT 0.2 µm |

TABLE 1-continued

| EVALUATION ITEM | RESULT |
| --- | --- |
| LIGHT TRANSMITTANCE (@550 nm) | 84% (LIGHT TRANSMITTANCE OF TRANSPARENT POLYIMIDE FILM WAS 89%) |
| ELECTRIC RESISTANCE | 300 TO 1000 Ω/□ |
| ADHESION | CROSS-CUT TEST (CONFORMING TO JIS K 5600-5-6) |
| | FILM WAS LEFT IN ALL 100 (10 × 10) SQUARES EVEN AFTER 3 TIMES OF TEST. |
| | BENDING RESISTANCE (SEAM BENDING) TEST (CONFORMING TO |
| | JIS C 5016, JPCA-DG02-2006) |
| | NEITHER DELAMINATION NOR RESISTANCE CHANGE OCCURRED IN |
| | TRANSPARENT CONDUCTIVE FILM EVEN AFTER 3 TIMES OF TEST. |
| FLEXIBILITY | NEITHER DELAMINATION NOR RESISTANCE CHANGE OCCURRED IN |
| | TRANSPARENT CONDUCTIVE FILM EVEN AFTER 100 TIMES OF REPEATED |
| | BENDING WITH BENDING RADIUS R = 2 mm. |
| HEAT RESISTANCE | NEITHER DELAMINATION NOR RESISTANCE CHANGE OCCURRED IN |
| | TRANSPARENT CONDUCTIVE FILM EVEN AFTER 3 TIMES OF REFLOW PROCESS |
| | WITH PEAK TEMPERATURE AT 270° C. |

As seen from the evaluation results shown in Table 1, the transparent conductive film 2 obtained by sintering the ITO ink strongly adheres to the transparent polyimide film 1, and also has flexibility. Further, the characteristics remained unchanged even after the film had been subjected to a normal reflow process (peak temperature of 270° C.) three times, and hence it was confirmed that the film had sufficient heat resistance.

Moreover, it was confirmed that favorable characteristics were also exhibited in terms of the light transmittance and the electric resistance.

It should be noted that, for the sake of comparison, a transparent flexible printed wiring board was produced using a transparent polyimide film whose dimension change rate in association with the baking process at 230° C. was larger than 0.2%. Herein, Neopulim (LH-3430), manufactured by MITSUBISHI GAS CHEMICAL COMPANY, INC., was used. The ITO ink was applied and baked under the same conditions as above, and it was then confirmed that cracking occurs in the transparent conductive film, and further, partial delamination was found in the transparent conductive film. As thus described, the dimension change rate of the transparent film has a major effect on the quality of the transparent flexible printed wiring board.

Example 2

In Example 2, the PEDOT ink is applied in the form of a predetermined pattern onto the same substrate (transparent polyimide film 1) as in Example 1 by use of the screen-printing method. A commercially available PEDOT ink was used.

Next, there will be described a method for manufacturing a transparent flexible printed wiring board according to the present example.

(1) After optimization of a printing plate and printing conditions, the PEDOT ink was printed in the form of a predetermined pattern on the transparent polyimide film 1 by the screen-printing method.

(2) Subsequently, a sample printed with the ink droplet was dried at 130° C. for 30 minutes to form a transparent conductive film 4 (PEDOT film).

Figure 2:
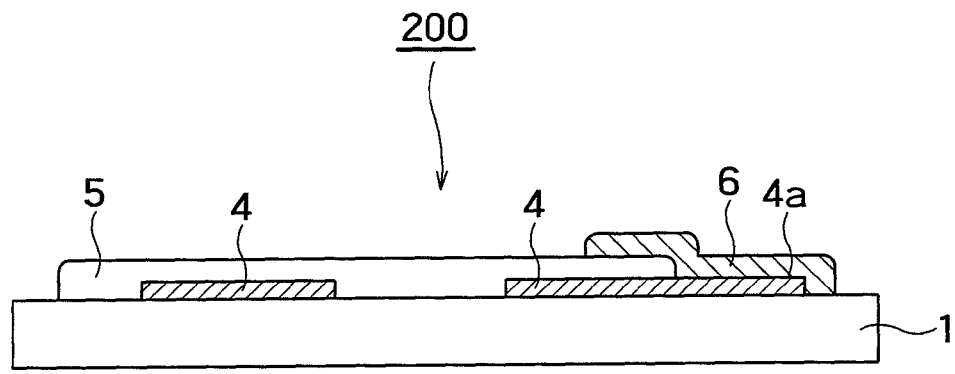
FIG. 2 is a sectional view of a transparent flexible printed wiring board according to Example 2.

(3) Thereafter, as seen from FIG. 2, a transparent insulating protection film 5 (thickness of about 10 μm) for protecting the transparent conductive film 4 was formed by use of the printing technique, so as to coat the transparent conductive film 4 (except for a terminal section 4a). The insulating protection film 5 is provided for the purpose of preventing the transparent conductive film 4, which is an organic conductive film obtained by drying the PEDOT ink, from oxidizing at the time of the heat process.

In addition, similarly to the transparent polyimide film 1 and the transparent conductive film 4, the insulating protection film 5 is also required to have heat resistance to the heat process (reflow process, etc.), to which the transparent flexible printed wiring board is to be subjected. As a transparent resist to serve as a material for the insulating protection film 5, a transparent and heat-resistant resist can be readily obtained by removing a pigment from a commercially available pigment-containing resist.

(4) Then, silver nano-ink was printed by the ink-jet method on the terminal section 4a, which serves for connection with an external section, in the transparent conductive film 4. It is to be noted that the ink is not restricted to the silver nano-ink, but another conductive ink such as gold nano-ink may be used.

(5) Subsequently, as shown in FIG. 2, the baking process was performed at 130° C. for 30 minutes to cure the printed silver nano-ink, so as to form a terminal protection film 6. The terminal protection film 6 had a film thickness of about 1 μm.

A transparent flexible printed wiring board 200 shown in FIG. 2 is obtained through the above process.

The transparent flexible printed wiring board 200 was evaluated in terms of light transmittance, electric resistance (conductivity), adhesion, flexibility, and heat resistance. Table 2 shows evaluation results.

TABLE 2

| EVALUATION ITEM | RESULT |
| --- | --- |
| THICKNESS OF TRANSPARENT CONDUCTIVE FILM (PEDOT FILM) | ABOUT 0.5 μm |
| LIGHT TRANSMITTANCE (@550 nm) | 80% (LIGHT TRANSMITTANCE OF TRANSPARENT POLYIMIDE FILM WAS 89%) |
| ELECTRIC RESISTANCE | 300 TO 1000 Ω/□ |
| ADHESION | CROSS-CUT TEST (CONFORMING TO JIS K 5600-5-6) |

TABLE 2-continued

| EVALUATION ITEM | RESULT |
| --- | --- |
| | FILM WAS LEFT IN ALL 100 (10 × 10) SQUARES EVEN AFTER 3 TIMES OF TEST. |
| | BENDING RESISTANCE (SEAM BENDING) TEST (CONFORMING TO |
| | JIS C 5016, JPCA-DG02-2006) |
| | NEITHER DELAMINATION NOR RESISTANCE CHANGE OCCURRED IN |
| | TRANSPARENT CONDUCTIVE FILM EVEN AFTER 3 TIMES OF TEST. |
| FLEXIBILITY | NEITHER DELAMINATION NOR RESISTANCE CHANGE OCCURRED IN |
| | TRANSPARENT CONDUCTIVE FILM EVEN AFTER 100 TIMES OF REPEATED |
| | BENDING WITH BENDING RADIUS R = 2 mm. |
| HEAT RESISTANCE | NO DELAMINATION OCCURRED IN TRANSPARENT CONDUCTIVE FILM AND |
| | RESISTANCE CHANGE THEREIN WAS NOT LARGER THAN ±10% EVEN AFTER |
| | 3 TIMES OF REFLOW PROCESS WITH PEAK TEMPERATURE AT 270° C. |

As seen from the evaluation results shown in Table 2, the transparent conductive film 4 obtained by drying the PEDOT ink strongly adheres to the transparent polyimide film 1, and also has flexibility. Further, the characteristics hardly changed even after the film had been subjected to a normal reflow process (peak temperature of 270° C.) three times, and hence it was confirmed that the film had sufficient heat resistance.

Moreover, it was confirmed that favorable characteristics were also exhibited in terms of the light transmittance and the electric resistance.

In addition, although a slight change (not larger than ±10%) was found in terms of the electric resistance, it was confirmed that almost no change was made in electric resistance after the initial reflow process. It is assumed therefrom that, despite a slight change in electric resistance due to oxidation of a surface layer of the transparent conductive film 4, an oxidized layer formed on the surface layer functions as a protection film in the subsequent reflow processes, thereby preventing further deterioration.

Example 3

In Example 3, the PEDOT ink is applied in the form of a predetermined pattern onto the same substrate (transparent polyimide film 1) as in Example 1 by use of the ink-jet method. A commercially available PEDOT ink was used.

Next, there will be described a method for manufacturing a transparent flexible printed wiring board according to the present example.

(1) After optimization of ink-jet conditions (setting of the viscosity and surface tension of the PEDOT ink in the foregoing ranges), the PEDOT ink was printed in the form of a predetermined pattern on the transparent polyimide film 1 by the ink-jet method. In addition, it is preferable to preliminarily heat the transparent polyimide film 1 to 50 to 60° C. before printing. This can prevent blurring and spreading of an ink droplet after its landing on the film.

(2) Subsequently, as seen from FIG. 3, a sample printed with the ink droplet was dried at 130° C. for 30 minutes to form a transparent conductive film 7 (PEDOT film).

Figure 3:
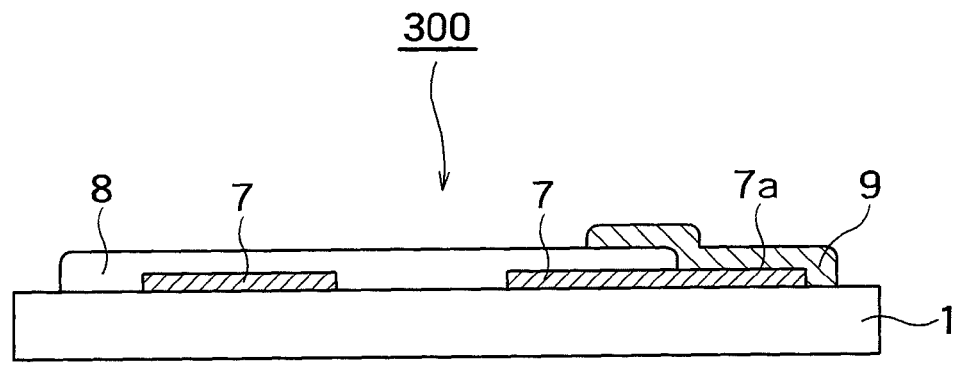
FIG. 3 is a sectional view of a transparent flexible printed wiring board according to Example 3.

(3) Thereafter, as seen from FIG. 3, a transparent insulating protection film 8 (thickness of about 10 μm) for protecting the transparent conductive film 7 was formed by use of the printing technique, so as to coat the transparent conductive film 7 (except for a terminal section 7a). Similarly to the transparent polyimide film 1 and the transparent conductive film 7, the insulating protection film 8 is also required to have heat resistance to the heat process (reflow process, etc.), to which the transparent flexible printed wiring board is to be subjected. In addition, as a transparent resist to serve as a material for the insulating protection film 8, a transparent and heat-resistant resist can be readily obtained by removing a pigment from a commercially available pigment-containing resist.

(4) Then, as seen from FIG. 3, silver nano-ink was printed by the ink-jet method on the terminal section 7a, which serves for connection with an external section, in the transparent conductive film 7. It is to be noted that the ink is not restricted to the silver nano-ink, but another conductive ink such as gold nano-ink may be used.

(5) Subsequently, the baking process was performed at 130° C. for 30 minutes and the printed silver nano-ink was cured to form a terminal protection film 9. The terminal protection film 9 had a film thickness of about 1 μm.

A transparent flexible printed wiring board 300 shown in FIG. 3 is obtained through the above process.

The transparent flexible printed wiring board 300 was evaluated in terms of light transmittance, electric resistance (conductivity), adhesion, flexibility, and heat resistance. Table 3 shows evaluation results.

TABLE 3

| EVALUATION ITEM | RESULT |
| --- | --- |
| THICKNESS OF TRANSPARENT CONDUCTIVE FILM (PEDOT FILM) | ABOUT 0.5 μm |
| LIGHT TRANSMITTANCE (@550 nm) | 82% (LIGHT TRANSMITTANCE OF TRANSPARENT POLYIMIDE FILM WAS 89%) |
| ELECTRIC RESISTANCE | 500 TO 1000 Ω/□ |
| ADHESION | CROSS-CUT TEST (CONFORMING TO JIS K 5600-5-6) |
| | FILM WAS LEFT IN ALL 100 (10 × 10) SQUARES EVEN AFTER 3 TIMES OF TEST. |
| | BENDING RESISTANCE (SEAM BENDING) TEST (CONFORMING TO |
| | JIS C 5016, JPCA-DG02-2006) |
| | NEITHER DELAMINATION NOR RESISTANCE CHANGE OCCURRED IN |
| | TRANSPARENT CONDUCTIVE FILM EVEN AFTER 3 TIMES OF TEST. |
| FLEXIBILITY | NEITHER DELAMINATION NOR RESISTANCE CHANGE OCCURRED IN |
| | TRANSPARENT CONDUCTIVE FILM EVEN AFTER 100 TIMES OF REPEATED |
| | BENDING WITH BENDING RADIUS R = 2 mm. |

TABLE 3-continued

| EVALUATION ITEM | RESULT |
|---|---|
| HEAT RESISTANCE | NO DELAMINATION OCCURRED IN TRANSPARENT CONDUCTIVE FILM AND RESISTANCE CHANGE THEREIN WAS NOT LARGER THAN ±10% EVEN AFTER 3 TIMES OF REFLOW PROCESS WITH PEAK TEMPERATURE AT 270° C. |

As seen from the evaluation results shown in Table 3, the transparent conductive film 7 obtained by drying the PEDOT ink strongly adheres to the transparent polyimide film 1, and also has flexibility. Further, the characteristics hardly changed even after the film had been subjected to a normal reflow process (peak temperature of 270° C.) three times, and hence it was confirmed that the film had sufficient heat resistance.

Moreover, it was confirmed that favorable characteristics were also exhibited in terms of the light transmittance and the electric resistance.

Example 4

A transparent flexible printed wiring board according to the present example has a plurality of transparent wiring layers. That is, it has a configuration where predetermined parts of the transparent conductive film formed on the substrate are electrically connected to each other through a transparent jumper joint section obtained by drying the PEDOT ink.

Next, there will be described a method for manufacturing the transparent flexible printed wiring board according to the present example.

(1) The transparent flexible printed wiring board 100 (see FIG. 1(a)) is obtained by the method described in Example 1.

(2) Subsequently, a transparent insulating protection film 10 for protecting the transparent conductive film 2 is formed by use of the ink-jet method. As seen from FIG. 4, the insulating protection film 10 has an opening 10a, and a part of the transparent conductive film 2 is exposed on the bottom surface of the opening 10a. In addition, similarly to the transparent polyimide film 1 and the transparent conductive film 2, the insulating protection film 10 is also required to have heat resistance.

Figure 4:
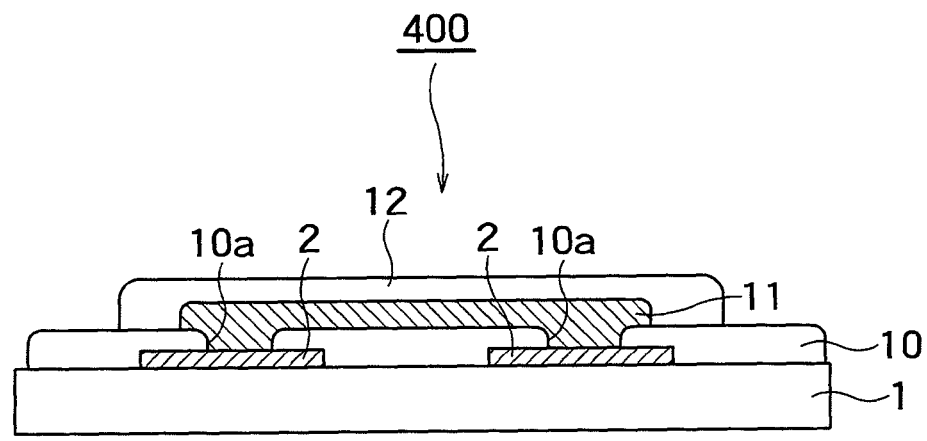
FIG. 4 is a sectional view of a transparent flexible printed wiring board according to Example 4.

(3) Then, after optimization of ink-jet conditions (setting of the viscosity and surface tension of the PEDOT ink in the foregoing ranges), as seen from FIG. 4, the PEDOT ink was printed inside the opening 10a and on the insulating protection film 10 by the printing technique (e.g., ink-jet method). In addition, it is preferable to preliminarily heat the transparent polyimide film 1 to 40 to 60° C. before printing. This can prevent blurring and spreading of an ink droplet after its landing on the film.

(4) Subsequently, a sample printed with the ink droplet was dried at 130° C. for 30 minutes to form a transparent jumper joint section 11 (PEDOT film). As seen from FIG. 4, the jumper joint section 11 serves to electrically connect between predetermined parts of the transparent conductive film 2.

(5) Thereafter, as shown in FIG. 4, a transparent insulating protection film 12 (thickness of about 2 μm) for protecting the jumper joint section 11 was formed by use of the printing technique, so as to coat the jumper joint section 11. Similarly to the transparent polyimide film 1, the transparent conductive film 2 and the like, the insulating protection film 12 is also required to have heat resistance to the heat process (reflow process, etc.), to which the transparent flexible printed wiring board is to be subjected.

A transparent flexible printed wiring board 400 shown in FIG. 4 is obtained through the above process.

The transparent flexible printed wiring board 400 was evaluated in terms of light transmittance, electric resistance (conductivity), adhesion, flexibility, and heat resistance. Table 4 shows evaluation results.

TABLE 4

| EVALUATION ITEM | RESULT |
|---|---|
| THICKNESS OF TRANSPARENT CONDUCTIVE FILM | ITO FILM: ABOUT 0.2 μm, PEDOT FILM: ABOUT 0.5 μm |
| LIGHT TRANSMITTANCE (@550 nm) | 75% (LIGHT TRANSMITTANCE OF TRANSPARENT POLYIMIDE FILM WAS 89%) |
| ELECTRIC RESISTANCE | 500 TO 1000 Ω/□ |
| ADHESION | CROSS-CUT TEST (CONFORMING TO JIS K 5600-5-6) FILM WAS LEFT IN ALL 100 (10 × 10) SQUARES EVEN AFTER 3 TIMES OF TEST. BENDING RESISTANCE (SEAM BENDING) TEST (CONFORMING TO JIS C 5016, JPCA-DG02-2006) NEITHER DELAMINATION NOR RESISTANCE CHANGE OCCURRED IN TRANSPARENT CONDUCTIVE FILM EVEN AFTER 3 TIMES OF TEST. |
| FLEXIBILITY | NEITHER DELAMINATION NOR RESISTANCE CHANGE OCCURRED IN TRANSPARENT CONDUCTIVE FILM EVEN AFTER 100 TIMES OF REPEATED BENDING WITH BENDING RADIUS R = 2 mm. |
| HEAT RESISTANCE | NO DELAMINATION OCCURRED IN TRANSPARENT CONDUCTIVE FILM AND RESISTANCE CHANGE THEREIN WAS NOT LARGER THAN ±10% EVEN AFTER 3 TIMES OF REFLOW PROCESS WITH PEAK TEMPERATURE AT 270° C. |

As seen from the evaluation results shown in Table 4, the transparent conductive film 2 and the jumper joint section 11 have sufficient adhesion and flexibility. Further, the characteristics hardly changed even after the film had been subjected to a normal reflow process (peak temperature of 270° C.) three times, and hence it was confirmed that the film had sufficient heat resistance.

Moreover, it was confirmed that favorable characteristics were also exhibited in terms of the light transmittance and the electric resistance.

According to the present example, it is possible to produce a transparent flexible printed wiring board having a complex wiring pattern.

In addition, the transparent conductive film 2 obtained by sintering the ITO ink on the transparent polyimide film 1 was formed in the present example, but in place of this, a transparent conductive film obtained by drying the PEDOT ink may be formed as described in Examples 2 and 3.

In the above, the four examples were described. Although the transparent polyimide film was used as the transparent insulating film to serve as the substrate in these examples, a transparent insulating film such as an aramid or nano-alloy transparent film can also be used so long as it satisfies the conditions on the dimension change rate and the like.

As described above, according to the present invention, there is provided a transparent flexible printed wiring board which is excellent in adhesion between the transparent film substrate and the transparent conductive film and has flexibility and heat resistance.

Further, according to the present invention, the transparent conductive film and the insulating protection film are all formed by the printing technique, thereby providing a method for manufacturing a transparent flexible printed wiring board wasting no material and having a smaller environmental load as compared with a manufacturing method using a conventional etching process.

Although those skilled in the art may conceive an additional effect or a variety of modifications of the present invention based on the above descriptions, the present invention is not restricted to the foregoing individual examples. Constitutional elements over different examples may be combined as appropriate. A variety of additions, modifications, and partial deletions can be made in a range not deviating from the conceptual thought and the gist of the present invention led from contents defined in the claims and equivalents thereto.

DESCRIPTION OF REFERENCE NUMERALS

1: transparent polyimide film
2, 4, 7: transparent conductive film
4a, 7a: terminal section
3, 5, 8, 10, 12: insulating protection film
6, 9: terminal protection film
10a: opening
11: jumper joint section
100, 100A, 200, 300, 400: transparent flexible printed wiring board

The invention claimed is:

1. A transparent flexible printed wiring board, comprising:
a transparent insulating film whose dimension change rate in association with a heat process at 230 to 300° C. is not larger than ±0.2%;
a transparent conductive film obtained by baking ITO ink and formed on the transparent insulating film, the transparent conductive film having a binder ratio of 5 to 10 wt %;
a heat-resisting transparent first insulating protection film which is formed so as to coat the transparent conductive film and has an opening, a part of the transparent conductive film being exposed on the bottom surface of the opening;
a jumper joint section formed by drying PEDOT ink printed inside the opening and on the first insulating protection film; and
a heat-resisting transparent second insulating protection film formed so as to coat the jumper joint section.

2. A transparent flexible printed wiring board, comprising:
a transparent insulating film whose dimension change rate in association with a heat process at 230 to 300° C. is not larger than ±0.2%;
a transparent conductive film obtained by drying the PEDOT ink and formed on the transparent insulating film;
a heat-resisting transparent first insulating protection film which is formed so as to coat the transparent conductive film and has an opening, a part of the transparent conductive film being exposed on the bottom surface of the opening;
a jumper joint section formed by drying PEDOT ink printed inside the opening and on the first insulating protection film; and
a heat-resisting transparent second insulating protection film formed so as to coat the jumper joint section.

3. A method for manufacturing a transparent flexible printed wiring board, comprising:
preparing a transparent insulating film whose dimension change rate in association with a heat process at 230 to 300° C. is not larger than ±0.2%;
printing ITO ink, which contains ITO fine particles and a binder, in the form of a predetermined pattern on the transparent insulating film by an ink-jet method;
baking the ITO ink, thereby forming a transparent conductive film with a binder ratio of 5 to 10 wt %;
forming a heat-resisting transparent first insulating protection film having an opening by a printing technique, after formation of the transparent conductive film, a predetermined part of the transparent conductive film being exposed on the bottom surface of the opening;
printing PEDOT ink inside the opening and on the first insulating protection film;
drying the PEDOT ink, thereby forming a transparent jumper joint section; and
forming a heat-resisting transparent second insulating protection film by a printing technique so as to coat the jumper joint section.

4. The method for manufacturing a transparent flexible printed wiring board according to claim 3, wherein a viscosity and a surface tension of the ITO ink that is printed on the transparent insulating film are respectively 2 to 20 mPa×S and 20 to 40 mN/m (both are values at 23° C.).

5. The method for manufacturing a transparent flexible printed wiring board according to claim 4, wherein, as the transparent insulating film, a transparent insulating film whose contact angle with a water droplet dropped on the transparent insulating film is in the range of 60 to 80° at 23° C. is used.

6. The method for manufacturing a transparent flexible printed wiring board according to claim 3, wherein as the transparent insulating film, a transparent insulating film whose contact angle with a water droplet dropped on the transparent insulating film is in the range of 60 to 80° at 23° C. is used.

7. A method for manufacturing a transparent flexible printed wiring board, comprising:
preparing a transparent insulating film whose dimension change rate in association with a heat process at 230 to 300° C. is not larger than ±0.2%;
printing PEDOT ink in the form of a predetermined pattern on the transparent insulating film by a screen-printing method or an ink-jet method;
drying the PEDOT ink, thereby forming a transparent conductive film;
forming a heat-resisting transparent first insulating protection film having an opening by a printing technique, after formation of the transparent conductive film, a predetermined part of the transparent conductive film being exposed on the bottom surface of the opening;

printing PEDOT ink inside the opening and on the first insulating protection film;

drying the PEDOT ink, thereby forming a transparent jumper joint section; and forming a heat-resisting transparent second insulating protection film by a printing technique so as to coat the jumper joint section.

8. The method for manufacturing a transparent flexible printed wiring board according to claim 7, wherein a viscosity and a surface tension of the PEDOT ink that is printed on the transparent insulating film are respectively 2 to 20 mPa×S and 20 to 40 mN/m (both are values at 23° C.) in the case of printing the PEDOT ink on the transparent insulating film by the ink-jet method.

9. The method for manufacturing a transparent flexible printed wiring board according to claim 8, wherein as the transparent insulating film, a transparent insulating film whose contact angle with a water droplet dropped on the transparent insulating film is in the range of 60 to 80° at 23° C. is used.

10. The method for manufacturing a transparent flexible printed wiring board according to claim 7, wherein as the transparent insulating film, a transparent insulating film whose contact angle with a water droplet dropped on the transparent insulating film is in the range of 60 to 80° at 23° C. is used.

11. The method for manufacturing a transparent flexible printed wiring board according to claim 7, comprising:

printing conductive ink on a terminal section of the transparent conductive film, which is exposed without being coated by the insulating protection film; and subsequently baking the conductive ink, thereby forming a terminal protection film.

* * * * *